United States Patent [19]
Yang et al.

[11] Patent Number: 6,165,695
[45] Date of Patent: Dec. 26, 2000

[54] THIN RESIST WITH AMORPHOUS SILICON HARD MASK FOR VIA ETCH APPLICATION

[75] Inventors: Chih Yuh Yang, San Jose; Christopher F. Lyons, Fremont; Harry J. Levinson, Saratoga; Khanh B. Nguyen, San Mateo; Fei Wang; Scott A. Bell, both of San Jose, all of Calif.

[73] Assignee: Advanced Micro Devices, Inc., Sunnyvale, Calif.

[21] Appl. No.: 09/203,150

[22] Filed: Dec. 1, 1998

[51] Int. Cl.$^7$ ........................................ G03C 5/00
[52] U.S. Cl. .................. 430/314; 430/316; 430/317; 430/967
[58] Field of Search ................... 430/311, 313, 430/316, 314, 317, 967; 438/423, 424; 216/39, 47, 72

[56] References Cited

U.S. PATENT DOCUMENTS

| | | | |
|---|---|---|---|
| 4,299,911 | 11/1981 | Ochi et al. | 430/286 |
| 5,040,020 | 8/1991 | Rauschenbach et al. | 355/53 |
| 5,534,312 | 7/1996 | Hill et al. | 427/533 |
| 5,580,687 | 12/1996 | Leedy | 430/5 |
| 5,757,077 | 5/1998 | Chung et al. | 257/736 |
| 5,786,262 | 7/1998 | Jang et al. | 438/424 |
| 5,817,567 | 10/1998 | Jang et al. | 438/427 |
| 5,989,776 | 11/1999 | Felter et al. | 430/270.1 |
| 6,001,538 | 12/1999 | Chen et al. | 430/316 |
| 6,025,117 | 2/2000 | Nakano et al. | 430/314 |

FOREIGN PATENT DOCUMENTS 62-128174  6/1987  Japan .

*Primary Examiner*—Mark F. Huff
*Assistant Examiner*—Saleha R. Mohamedulla
*Attorney, Agent, or Firm*—Amin, Eschweiler & Turocy, LLP

[57] ABSTRACT

A method of forming a via structure is provided. In the method, a dielectric layer is formed on an anti-reflective coating (ARC) layer covering a first metal layer; and an amorphous silicon layer is formed on the dielectric layer. An ultra-thin photoresist layer is formed on the amorphous silicon layer, and the ultra-thin photoresist layer is patterned with short wavelength radiation to define a pattern for a via. The patterned ultra-thin photoresist layer is used as a mask during a first etch step to transfer the via pattern to the amorphous silicon layer. The first etch step includes an etch chemistry that is selective to the amorphous silicon layer over the ultra-thin photoresist layer and the dielectric layer. The amorphous silicon layer is employed as a hard mask during a second etch step to form a contact hole corresponding to the via pattern by etching portions of the dielectric layer.

32 Claims, 9 Drawing Sheets

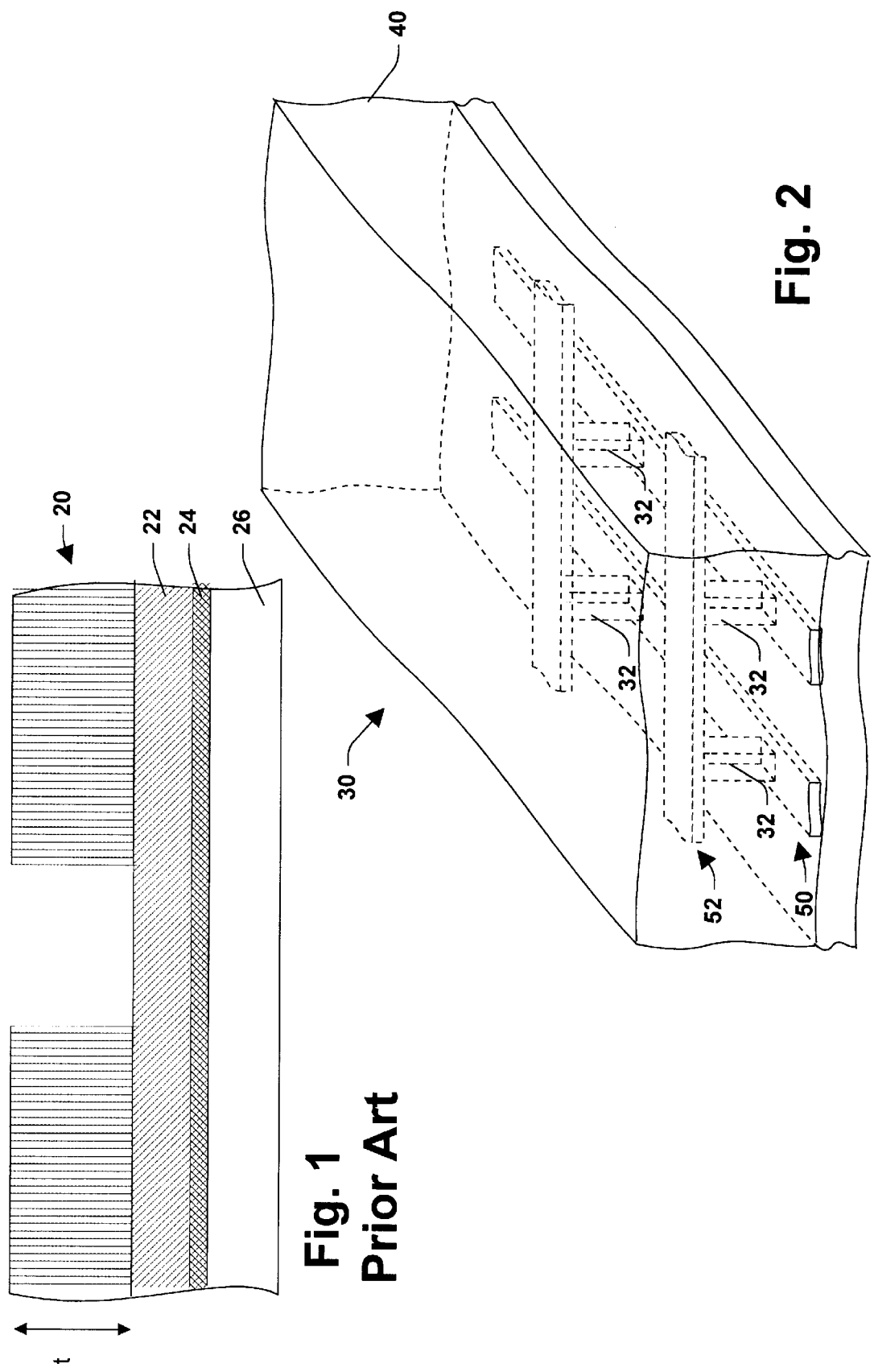

THIN RESIST WITH AMORPHOUS SILICON HARD MASK FOR VIA ETCH APPLICATION

TECHNICAL FIELD

The present invention generally relates to photolithography, and more particularly relates to a method of forming sub-micron vias using short wavelength radiation and ultra-thin photoresists.

BACKGROUND OF THE INVENTION

In the semiconductor industry, there is a continuing trend toward higher device densities. To achieve these high densities, there has been and continues to be efforts toward scaling down the device dimensions (e.g., at submicron levels) on semiconductor wafers. In order to accomplish such high device packing density, smaller and smaller feature sizes are required. This may include the width and spacing of interconnecting lines, spacing and diameter of contact holes (vias), and the surface geometry such as comers and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the photoresist, and an exposing source (such as optical light, x-rays, or an electron beam) illuminates selected areas of the surface through an intervening master template, the mask, for a particular pattern. The photoresist receives a projected image of the subject pattern. Once the image is projected, it is indelibly formed in the photoresist. The projected image may be either a negative or a positive image of the subject pattern. Exposure of the photoresist through a photomask causes the image area to become either more or less soluble (depending on the coating) in a particular solvent developer. The more soluble areas are removed in the developing process to leave the pattern image in the photoresist as less soluble polymer.

Projection lithography is a powerful and essential tool for microelectronics processing. As feature sizes are driven smaller and smaller, optical systems are approaching their limits caused by the wavelengths of the optical radiation. A recognized way of reducing the feature size of circuit elements is to lithographically image the features with radiation of a shorter wavelength. "Long" or "soft" x-rays (a.k.a, extreme ultraviolet (EUV)), wavelength range of lambda=50 to 700 Angstroms (Å) are now at the forefront of research in an effort to achieve the smaller desired feature sizes.

Although EUV lithography provides substantial advantages with respect to achieving high resolution patterning, the shorter wavelength radiation is highly absorbed by the photoresist material. Consequently, the penetration depth of the radiation into the photoresist is limited. The limited penetration depth of the shorter wavelength radiation requires the use of ultra-thin photoresists so that the radiation can penetrate the entire depth of the photoresist in order to effect patterning thereof. However, the thinness of such ultra-thin photoresists results in the etch resistance thereof to be relatively low. In other words, the etch protection afforded by ultra-thin photoresists is limited which in turn limits the EUV lithographic process.

SUMMARY OF THE INVENTION

The present invention relates to a method to facilitate lithographic processes employing extreme ultra-violet (EUV) radiation and/or deep UV radiation in fabricating vias. As noted above, EUV and deep UV radiation are preferred radiation sources in lithographic processes where fine resolution is desired. The short wavelengths of these types of radiation afford for fine patterning (e.g., critical feature sizes <0.25 $\mu$m). However, these types of radiation are highly absorbed by photoresist material which consequently limits the depth of penetration by the radiation into the photoresist material.

By employing an amorphous silicon layer to be patterned as a hard mask for use in connection with etching the vias, the present invention affords for expanding available etch chemistries useable in EUV and/or deep UV lithographic processes. In particular, these types of lithographic processes require the use of very thin photoresists as a result of the depth of penetration limitations of the short wavelength radiation. Such very thin photoresists are limited in their capacity as etch barriers due to the thickness thereof.

In the present invention, the ultra-thin photoresist is employed in patterning and etching (e.g., with a high selectivity fluorocarbon plasma) the amorphous silicon layer thereunder to form a hard mask. A via pattern formed in the photoresist with the short wavelength radiation is transferred to the amorphous silicon layer by a first etch step. The patterned amorphous silicon layer is used as a hard mask for a subsequent second etch step to etch a dielectric layer so as to form contact holes therein corresponding to the via pattern. Thereafter, standard via formation processes are performed to fill the contact holes, planarize the filler material, etc. to form the via having a cross-section with a largest transverse dimension less than 0.25 $\mu$m. Thus, the present invention affords for taking advantage of the fine resolution patterning available from EUV and deep UV lithographic processes and mitigates the limitations associated therewith with respect to etch chemistry.

One specific aspect of the present invention relates to a method of forming a via structure. In the method, a dielectric layer is formed on an anti-reflective coating (ARC) covering a first metal layer. An amorphous silicon layer is formed on the dielectric layer. An ultra-thin photoresist layer is formed on the amorphous silicon layer, and the ultra-thin photoresist layer is patterned with short wavelength radiation to define a pattern for the via structure. The patterned ultra-thin photoresist layer is used as a mask during a first etch step to transfer the via pattern to the amorphous silicon layer. The first etch step includes an etch chemistry that is selective to the amorphous silicon layer over the ultra-thin photoresist layer. The amorphous silicon layer is employed as a hard mask during a second etch step to form a contact hole corresponding to the via pattern by etching portions of the dielectric layer.

Another aspect of the present invention relates to a via structure having a largest transverse dimension below about 0.18 $\mu$m. In formning the structure, In the method, a dielectric layer is formed on an anti-reflective coating covering a first metal layer. An amorphous silicon layer is formed on the dielectric layer. An ultra-thin photoresist layer is formed on the amorphous silicon layer. The ultra-thin photoresist layer is patterned with short wavelength radiation to define a pattern for the via structure. The ultra-thin photoresist layer is used as a mask during a first etch step to transfer the via pattern to the amorphous silicon layer, the first etch step including an etch chemistry that is selective to the amorphous silicon layer over the ultra-thin photoresist layer and the dielectric layer. The amorphous silicon layer is used as a hard mask during a second etch step to form a contact hole corresponding to the via pattern by etching portions of the dielectric layer.

Another aspect of the present invention relates to a method of forming a via structure. In the method, a dielectric layer is formed on an anti-reflective coating covering a first metal layer. An amorphous silicon layer is formed on the dielectric layer, the amorphous silicon layer having a thickness within the range of 50 Å–2000 Å. An ultra-thin photoresist layer is formed on the amorphous silicon layer, the ultra-thin photoresist layer having a thickness within the range of 50 Å–2000 Å. The ultra-thin photoresist layer is patterned with short wavelength radiation to define a pattern for the via structure, the short wavelength radiation falling within the range of about 11 nm to 13 nm. The ultra-thin photoresist layer is used as a mask during a first etch step to transfer the via pattern to the amorphous silicon layer, the first etch step including an etch chemistry that is selective to the amorphous silicon layer over the ultra-thin photoresist layer and the dielectric layer. The amorphous silicon layer is used as a hard mask during a second etch step to form a contact hole corresponding to the via pattern by etching portions of the dielectric layer.

Yet another aspect of the present invention relates to a method of forming a multi-layered interconnect structure. In the method, a first dielectric layer is formed on an anti-reflective coating covering a first metal layer. An amorphous silicon layer is formed on the dielectric layer, the amorphous silicon layer having a thickness within the range of 50 Å–2000 Å. An ultra-thin photoresist layer is formed on the amorphous silicon layer, the ultra-thin photoresist layer having a thickness within the range of 50 Å–2000 Å. The ultra-thin photoresist layer is patterned with short wavelength radiation to define a pattern for a via, the short wavelength radiation falling within the range of about 11 nm to 13 nm. The ultra-thin photoresist layer is used as a mask during a first etch step to transfer the via pattern to the amorphous silicon layer. The first etch step includes an etch chemistry that is selective to the amorphous silicon layer over the ultra-thin photoresist layer. The amorphous silicon layer is employed as a hard mask during a second etch step to form a contact hole corresponding to the via pattern by etching portions of the dielectric layer. The contact hole is filled with a conductive material so as to form the via. The hard mask is removed and the conductive material planarized via CMP. A second metal layer is formed over the via, and a second dielectric layer is formed over the second metal layer.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a prior art schematic cross-sectional illustration of a conventional patterned resist used in the formation of vias;

FIG. 2 is a perspective illustration of a multi-layered interconnect structure employing vias formed in accordance with one aspect of the present invention;

DETAILED DESCRIPTION OF THE INVENTION

Figure 3A:
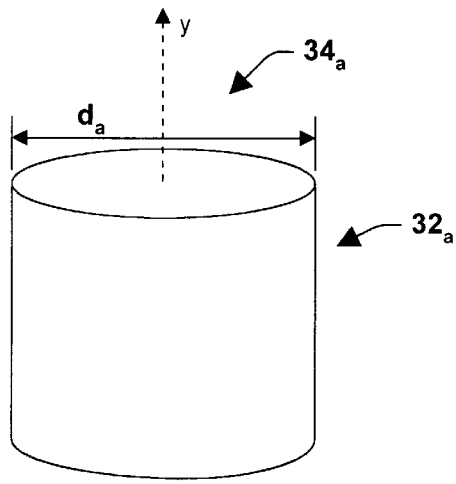
FIGS. 3a–3e illustrate representative filled via structures which may be formed in accordance with the present invention

The present invention will now be described with reference to the drawings, wherein like reference numerals are used to refer to like elements throughout. The method of the present invention will be described with reference to the formation of vias using a photolithographic process employing radiation of short wavelength (e.g., EUV radiation and/or deep UV radiation) and an ultra-thin photoresist. The following detailed description is of the best modes presently contemplated by the inventors for practicing the invention. It should be understood that the description of these preferred embodiments are merely illustrative and that they should not be taken in a limiting sense.

FIG. 1 is a cross-sectional illustration of a conventional photoresist layer 20 being used in the formation of via(s). As shown, the photoresist layer 20 is substantially thick (e.g., 5,000–10,000 Å). The photoresist layer 20 is shown patterned so as to define a via which will be etched into an underlying dielectric layer 22 so as to form a contact hole to an underlying anti-reflective coating layer 24 and a metal layer 26 However, the thickness of the photoresist layer 20 is not conducive for use with short wavelength radiation because these types of radiation would be highly absorbed by the photoresist layer 20 and not penetrate the entire thickness "t" of the layer 20. As a result, such a conventional scheme for forming a via would not be able to take advantage of the improved resolution of patterning offered by the short wavelength radiation.

Turning now to the present invention in detail, FIG. 2 illustrates an interconnect structure 30 having vias 32 formed in accordance with the present invention. The vias 32 are filled with a suitable material (e.g., tungsten, copper) to form plugs which provide conductive pathways through an insulating dielectric medium 40 to connect interconnects of different conductor layers 50, 52. Although, the present invention is described with respect to forming only two conductive layers 50, 52 for ease of understanding, it is to be appreciated that many more conductive layers (selectively electrically isolated with the dielectric material 40) may be formed, and such structures are intended to fall within the scope of the hereto appended claims.

The vias 32 are formed employing photolithographic techniques utilizing short wavelength radiation and ultra-thin photoresists. Accordingly, substantially smaller dimensions of the vias 32 are achieved as compared to vias formed in accordance with the prior art technique discussed with respect to FIG. 1. For example, the vias 32 may have respectively a critical feature dimension of less than about 0.25 μm, and such small dimension is not typically obtainable using conventional lithographic processes. In another embodiment, the vias may have respectively a critical feature dimension of less than about 0.18 μm.

FIGS. 3a–3e illustrate representative filled via structures which may be formed in accordance with the present invention. FIG. 3a depicts a via structure $32_a$ which is substantially cylindrical and has a substantially circular cross-section $34_a$. A diameter "$d_a$" of the cross-section 34a in one particular embodiment is less than about 0.25 μm. In another embodiment, the $d_a$ is less than about 0.18 μm.

Figure 3B:
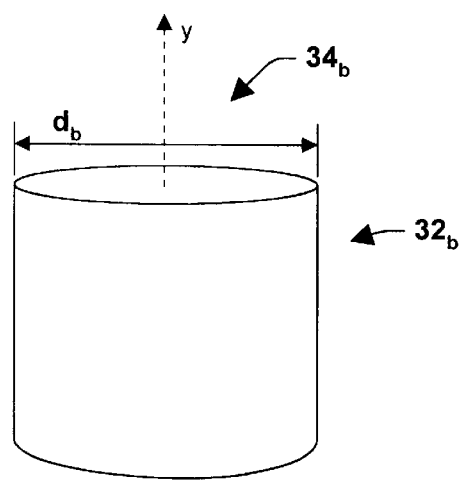

FIG. 3b depicts a via structure $32_b$ which is substantially cylindrical and has a substantially elliptical cross-section $34_b$. A length dimension for a major axis "$d_b$" of the cross-section $34_b$ in one particular embodiment is less than about 0.25 μm. In another embodiment, the $d_b$ is less than about 0.18 μm.

Figure 3C:
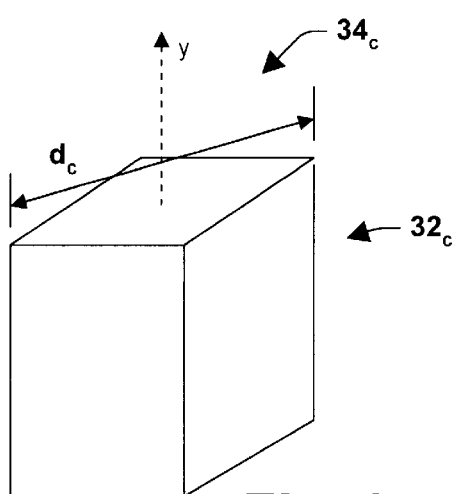

FIG. 3c depicts a via structure $32_c$ which is substantially cylindrical and has a substantially square cross-section $34_c$. A diagonal length dimension "$d_c$" of the cross-section $34_c$ in one particular embodiment is less than about 0.25 μm. In another embodiment, the $d_c$ is less than about 0.18 μm.

Figure 3D:
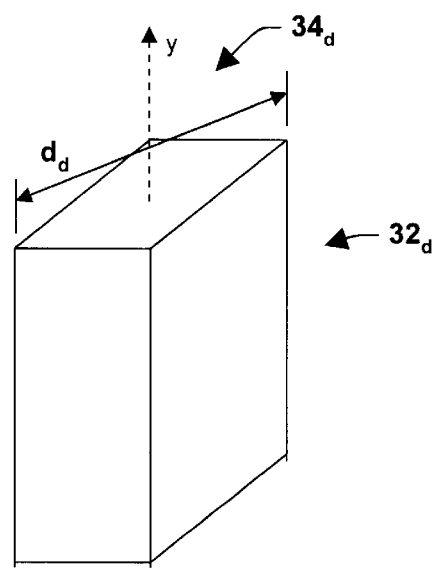

FIG. 3d depicts a via structure $32_d$ which is substantially cylindrical and has a substantially rectangular cross-section $34_d$. A diagonal length dimension "$d_d$" of the cross-section 34d in one particular embodiment is less than about 0.25 μm. In another embodiment, the $d_d$ is less than about 0.18 μm.

Figure 3E:
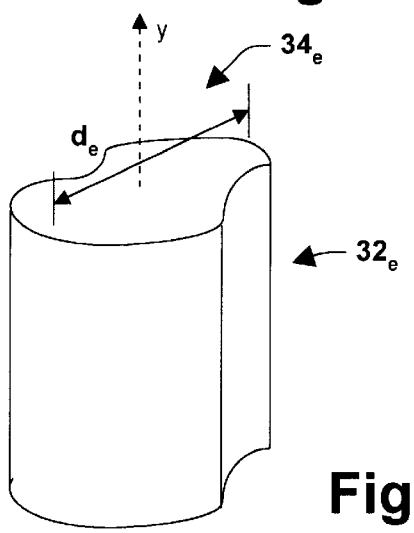

FIG. 3e depicts a via structure $32_e$ which is substantially cylindrical and has a substantially irregular shaped cross-section $34_e$. A largest transverse dimesion "$d_e$" of the cross-section $34_e$ in one particular embodiment is less than about 0.25 μm. In another embodiment, the $d_e$ is less than about 0.18 μm.

The various aforementioned dimensions ($d_a$, $d_b$, $d_c$, $d_d$, and $d_e$) will be referred to as the largest transverse dimensions, which are respectively the maximum length dimension of a transverse cross-section of the via 32 with respect to a y-axis as shown in FIGS. 3a–3e.

Figure 4:
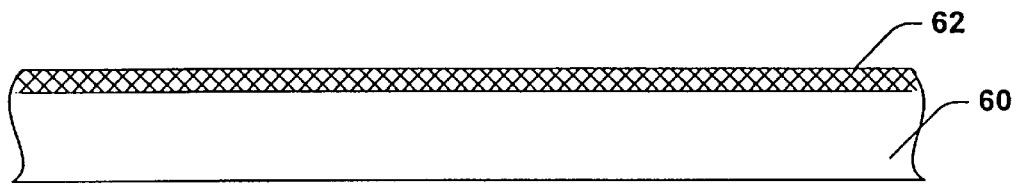
FIG. 4 is a schematic cross-sectional illustration of a metal layer having an anti-reflective coating (ARC) formed thereon in accordance with one aspect of the present invention.

Turning now to FIGS. 4–21, the fabrication of the vias 32 is discussed in greater detail. FIG. 4 is a cross-sectional illustration of a first metal layer 60, which is part of the conductive layer 50 (FIG. 2) and a graded anti-reflective coating (ARC) 62 formed thereon. Although not shown, it is to be appreciated that the first metal layer 60 may be formed over a substrate, for example. The first metal layer 60 may comprise any suitable conductive material employable for forming conductive patterns in the semiconductor industry. Preferably, the conductive material includes a member selected from the group consisting of refractory materials, such as titanium and titanium alloys, tungsten and tungsten alloys, aluminum and aluminum alloys, copper and copper alloys and polycrystalline silicon. The ARC 62 is left over from a previous patterning of the first metal layer 60 (e.g., to pattern metal lines). The ARC 62 preferably comprises titanium nitride (TiN), however, any like material may be employed. The ARC 62 serves as an etch stop layer for a dielectric etch step discussed in greater detail below. The ARC 62 is conductive and thus if remaining after the dielectric etch, the ARC 62 will not inhibit an electrically conductive connection between the first metal layer 60 and the via 32 which may serve as an electrically conductive link to another metal layer or element (e.g., conductive line).

Furthermore, the ARC 62 serves as an etch stop region during the dielectric etch to provide for a margin of error in the dielectric etch so as to mitigate damage to the first metal layer 60 by the dielectric etch. The thickness of the ARC layer 62 is preferably within the range of 300 Å–1500 Å, however, any thickness suitable for carrying out the aforementioned functions of the ARC 62 may be employed.

Figure 5:
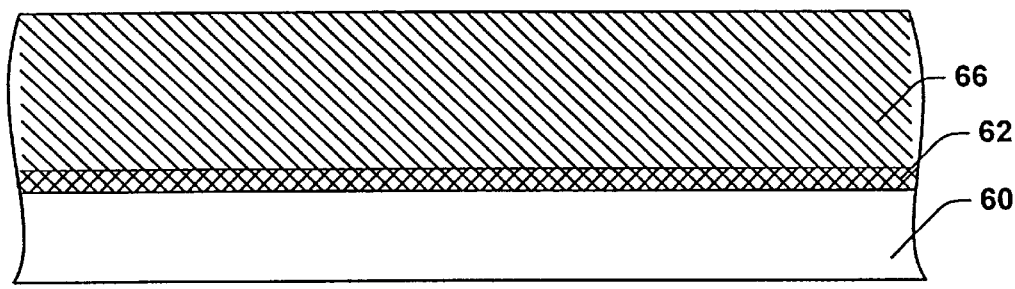
FIG. 5 is a schematic cross-sectional illustration of a dielectric layer formed over the ARC layer of FIG. 4 in accordance with one aspect of the present invention.

FIG. 5 illustrates a dielectric layer 66 formed over the ARC layer 62. The dielectric layer 66 is part of the dielectric 40. The dielectric layer provides for insulating conductive elements (e.g., adjacent metal lines) from each other so as to mitigate electrical shorting and/or capacitive crosstalk there between. Preferably, the dielectric layer 66 includes tetraethyorthosilicate (TEOS) However, and suitable insulating material (e.g., phosphosilicate glass (PSG), borophosphosilicate glass (BPSG), any suitable spin-on glass (SOG), or polyimides having a suitably low dielectric constant) may be employed. The dielectric layer 66 may be deposited by any suitable process (e.g., Low Pressure Chemical Vapor Deposition (LPCVD), Plasma Enhanced Chemical Vapor Deposition (PECVD), or High Density Plasma Chemical Vapor Deposition (HDPCVD)) to a desired thickness.

Figure 6:
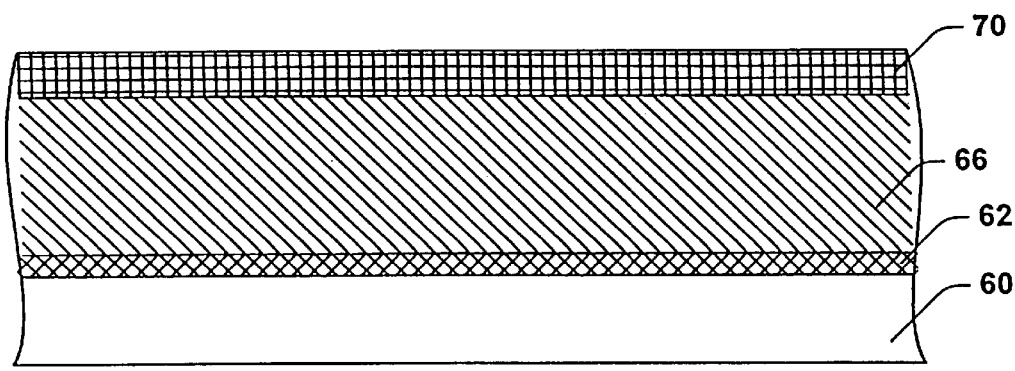
FIG. 6 is a schematic cross-sectional illustration of an amorphous silicon layer formed over the dielectric layer of FIG. 5 in accordance with one aspect of the present invention.

Next, as shown in FIG. 6, an amorphous silicon layer 70 is formed over the dielectric layer 66. The amorphous silicon layer 70 will serve as a hard mask during etching of the underlying dielectric layer 66. Any suitable technique for forming the amorphous silicon layer 70 may be employed such as LPCVD, PECVD, HDCVD, sputtering or high density plasma chemical vapor deposition (HDPCVD) techniques to a thickness suitable for serving as a hard mask for a selective etch of the dielectric layer 66. Thus, for example, in one aspect of the present invention the thickness of the amorphous silicon layer 70 is between the range of about 50 Å–10,000 Å. In another aspect, the thickness of the amorphous silicon layer 70 is between the range of about 50 Å–5000 Å. In another aspect, the thickness of the amorphous silicon layer 70 is between the range of about 50 Å–3000 Å. In another aspect, the thickness of the amorphous silicon layer 70 is between the range of about 50 Å–2000 Å. In another aspect, the thickness of the amorphous silicon layer 70 is between the range of about 50 Å–1500 Å. In another aspect, the thickness of the amorphous silicon layer 70 is between the range of about 50 Å–1000 Å. In still another aspect, the thickness of the amorphous silicon layer 70 is between the range of about 50 Å–500 Å.

Figure 7:
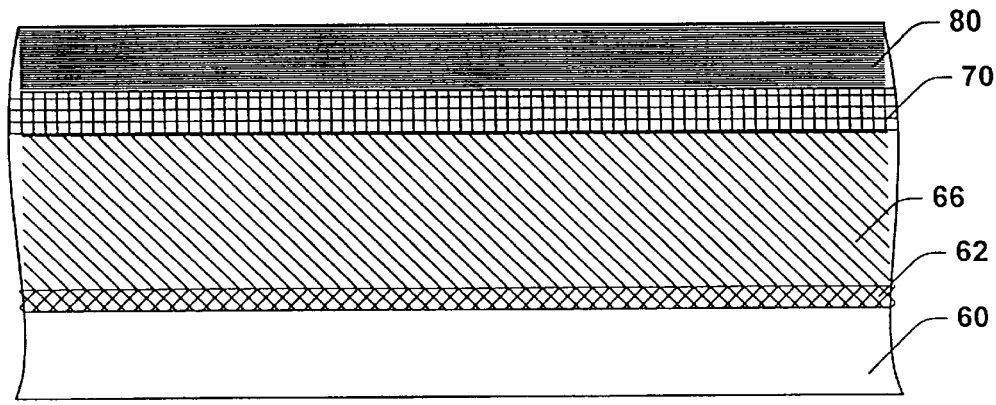
FIG. 7 is a schematic cross-sectional illustration of an ultra-thin photoresist layer formed over the amorphous silicon layer of FIG. 6 in accordance with one aspect of the present invention.

FIG. 7 illustrates an ultra-thin photoresist layer 80 formed over the amorphous silicon layer 70. The ultra-thin photoresist layer 80 has a thickness of about 500 Å–5000 Å, however, it is to be appreciated that the thickness thereof may be of any dimension suitable for carrying out the present invention. Accordingly, the thickness of the ultra-thin photoresist 80 can vary in correspondence with the wavelength of radiation used to pattern the ultra-thin photoresist 80. One aspect of the present invention provides for forming the ultra-thin photoresist layer 80 to have a thickness within the range of 1000 Å to 4000 Å. Another aspect of the present invention provides for forming the ultra-thin photoresist layer 80 to have a thickness within the range of 2000 Å to 3000 Å. Yet another aspect of the present invention provides for forming the ultra-thin photoresist layer 80 to have a thickness within the range of 500 Å to 2000 Å. The ultra-thin photoresist 80 may be formed over the amorphous silicon layer 70 via conventional spin-coating or spin casting deposition techniques.

The ultra-thin photoresist layer 80 has a thickness suitable for functioning as a mask for etching the underlying amorphous silicon layer 70 and for forming patterns or openings in the developed ultra-thin photoresist layer 80 that are 0.25 µm or less. Since the ultra-thin photoresist layer 80 is relatively thin compared with I-line, regular deep UV, and other photoresists, improved critical dimension control is realized.

Ultra-thin resists are processed using small wavelength radiation. Small wavelength radiation increases precision and thus the ability to improve critical dimension control. Specific examples of wavelengths to which the ultra-thin photoresist 80 is sensitive (undergo chemical transformation enabling subsequent development) include about 248 nm, about 193 nm, about 157 nm, about 13 nm and about 11 nm, and as low as 4 nm. Specific sources of radiation include KrF excimer lasers having a wavelength of about 248 nm, a XeHg vapor lamp having a wavelength from about 200 nm to about 250 nm, mercury-xenon arc lamps having a wavelength of about 248 nm, an ArF excimer laser having a wavelength of about 193 nm, an $F_2$ excimer laser having a wavelength of about 157 nm, and EUV having a wavelength of about 15 nm to about 10 nm, and as low as 4 nm.

Positive or negative ultra-thin photoresists may be employed in the methods of the present invention. An example of a deep UV chemically amplified photoresist is a partially t-butoxycarbonyloxy substituted poly-p-hydroxystyrene. Photoresists are commercially available from a number of sources, including Shipley Company, Kodak, Hoechst Celanese Corporation, Brewer and IBM. The scope of the present invention as defined by the hereto appended claims is intended to include any ultra-thin photoresist suitable for carrying out the present invention.

Figure 8:
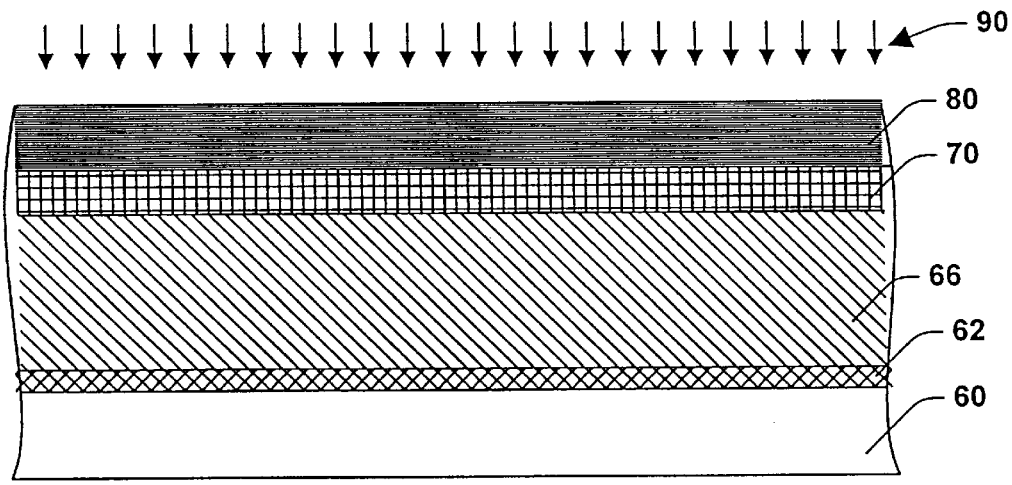
FIG. 8 is a schematic cross-sectional illustration of the ultra-thin photoresist layer of FIG. 7 undergoing a patterning step in accordance with one aspect of the present invention.
Figure 9:
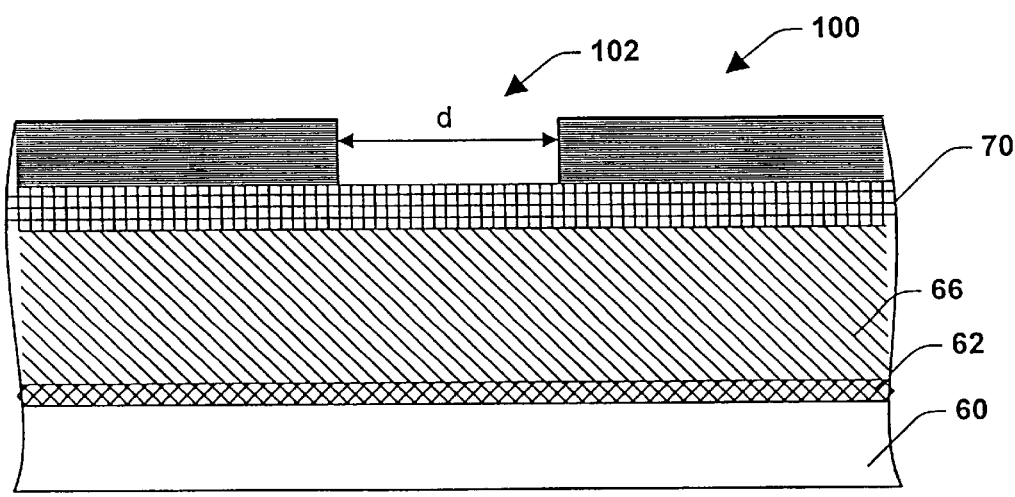
FIG. 9 is a schematic cross-sectional illustration of the ultra-thin photoresist layer of FIG. 8 after the patterning step is substantially complete in accordance with one aspect of the present invention.

Referring to FIG. 8, the ultra-thin photoresist layer 80 then undergoes an exposure/development step 90 to provide a patterned photoresist 100 (FIG. 9). The patterned photoresist 100 is formed using electromagnetic radiation having a relatively small wavelength (for example, less than 200 nm). In this embodiment, electromagnetic radiation having a wavelength of about 13 nm is employed. Since relatively small wavelengths are used, reflectivity concerns are minimized because larger wavelengths are more frequently associated with reflectivity problems. The ultra-thin photoresist layer 80 is selectively exposed to radiation; that is, selected portions of the ultra-thin photoresist layer 80 are exposed to radiation. Either the exposed or unexposed portions of the ultra-thin photoresist layer 80 are removed or developed to provide the patterned photoresist 100.

The critical feature dimension "d" of the exposed portion of the amorphous silicon layer 70 (opening 102 in the patterned photoresist 100) is about 0.25 µm or less, including about 0.18 µm or less, about 0.09 µm or less, about 0.075 µm or less and about 0.05 µm or less, depending on the wavelength of the radiation used.

The selectively exposed ultra-thin photoresist layer 80 is developed by contact with a suitable developer that removes either the exposed or unexposed portions of the ultra-thin photoresist layer 80. The identity of the developer depends upon the specific chemical constitution of the ultra-thin photoresist layer 80. For example, an aqueous alkaline solution may be employed to remove unexposed portions of the ultra-thin photoresist layer 80. Alternatively, one or more of dilute aqueous acid solutions, hydroxide solutions, water, and organic solvent solutions may be employed to remove selected portions of the ultra-thin photoresist layer 80. The developer is selected so that it does not degrade or etch the material of the amorphous silicon layer 70, or at least degrades or etches the material of the amorphous silicon layer 70 at a substantially slower rate as compared to the rate that the material of the ultra-thin photoresist layer 80 is developed. In other words, the amorphous silicon layer 70 serves as an etch-stop layer when developing the ultra-thin photoresist layer 80.

The patterned photoresist 100 may assume any suitable pattern, but typically the patterned photoresist 100 corresponds to the desired via pattern. In the present invention, the patterned photoresist 100 defines one or more vias. The patterned photoresist 100 defines one or more openings over the amorphous silicon layer 70 corresponding to the vias(s) 32 (FIG. 2) to be formed. The patterned photoresist 100 serves as an etch mask layer for processing or etching the underlying amorphous silicon layer 70.

Figure 10:
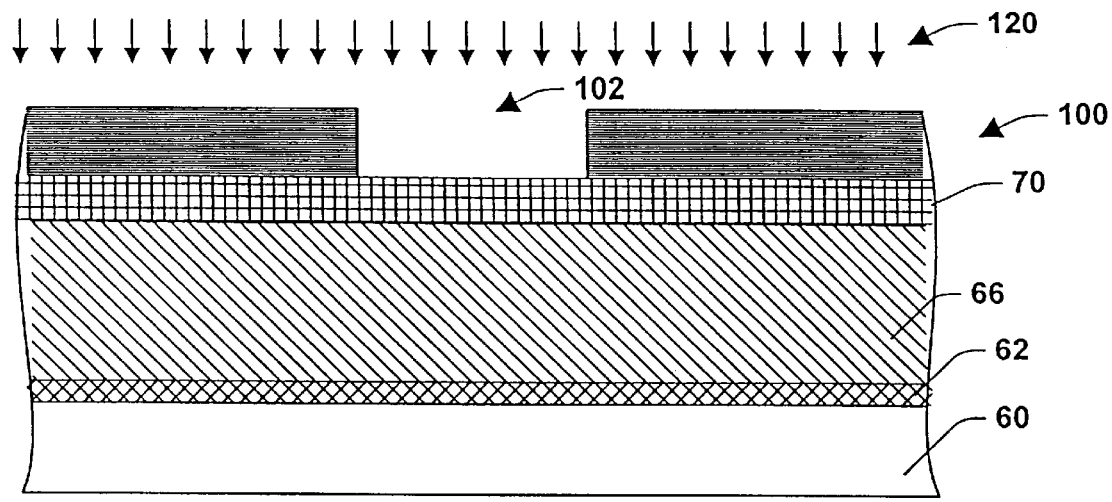
FIG. 10 is a schematic cross-sectional illustration of the amorphous silicon layer of FIG. 9 undergoing an etching step in accordance with one aspect of the present invention.
Figure 11:
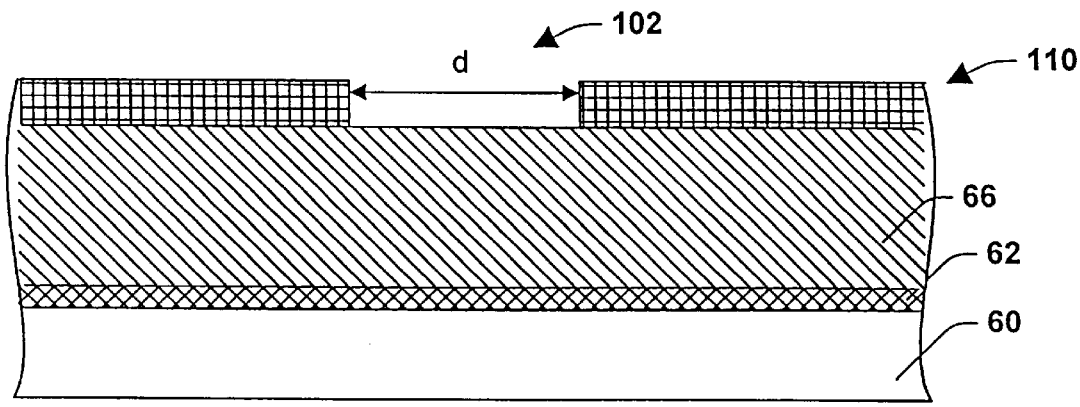
FIG. 11 is a schematic cross-sectional illustration of the amorphous silicon layer of FIG. 10 after the etching step is substantially complete in accordance with one aspect of the present invention.

Referring now to FIG. 10, the patterned photoresist 100 is used as a mask for selectively etching the amorphous silicon layer 70 to provide patterned amorphous silicon layer 110

(FIG. 11) from a first etch step 120. Any suitable etch technique may be used to etch the amorphous silicon layer 70. Preferably, a selective etch technique may be used to etch the material of the amorphous silicon layer 70 at a relatively greater rate as compared to the rate that the material of the patterned photoresist 100 is etched. The first etch step is also highly selective to the amorphous silicon layer 70 over the underlying dielectric layer 66 so as to mitigate damage to the dielectric layer 66.

Preferably, the amorphous silicon layer 70 is etched using an anisotropic etching process—dry or wet etching techniques may be employed, although dry etching is preferred. An amorphous silicon:photoresist etch technique may be used to etch the amorphous silicon layer 70 to provide the patterned amorphous silicon layer 110 and continue to define opening 102 exposing portions of the dielectric layer 66 lying under the patterned amorphous silicon layer 110. The amorphous silicon:photoresist etch selectivity may be within the range of 2:1 to greater than 40:1 depending on the amorphous silicon material, and one skilled in the art could readily tailor a suitable etch chemistry to correspond to the characteristics of the amorphous silicon layer 70 and the patterned photoresist 100. For example, using the patterned photoresist 100 as a mask, the amorphous silicon layer 70 is selectively etched with a $Cl_2$ chemistry which is highly selective of the amorphous silicon over the photoresist 100, to form a patterned amorphous silicon layer 110 exposing a portion of the dielectric layer 66.

The amorphous silicon 70 may be etched using magnetic enhanced reactive ion etching (MERIE) or a high density plasma system using $Cl_2$ chemistry that will not substantially attack the underlying dielectric layer (e.g. TEOS). According to the present example, a MERIE method is used with reactant gases of $CL_2$ (30–100 sccm) and HBr(30–100 sccm) at a power level within the range of about 300–700 W, and pressure within the range of about 10–250 mT. This chemistry has very high selectivity to the amorphous silicon over the photoresist material and the selectivity of various embodiments, respectively, may be tailored to be greater than 5:1; greater than 10:1; greater than 20:1; greater than 30:1; and greater than 40:1 depending on the particular embodiment employed.

Figure 12:
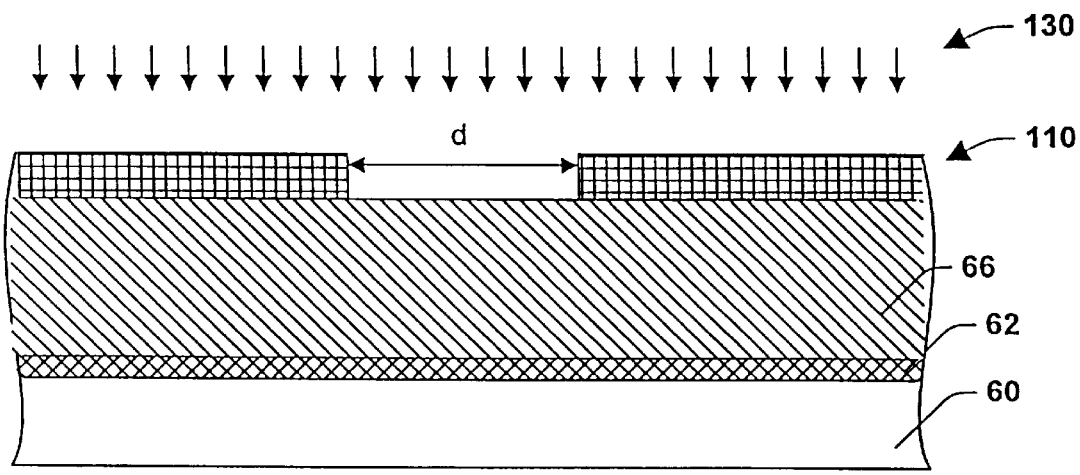
FIG. 12 is a schematic cross-sectional illustration of the amorphous silicon layer and dielectric layer of FIG. 11 undergoing an etching step in accordance with one aspect of the present invention.

Turning now to FIG. 12, the dielectric layer 66 is shown undergoing an etching process 130 wherein the patterned amorphous silicon layer 110 serves a hard mask thereto. For example, the etching process 130 may include a reactive ion etch (RIE), that is highly selective to the dielectric layer 66 with respect to the patterned amorphous silicon layer 110 and the ARC 62. It is to be appreciated that any suitable etch methodology for selectively etching the dielectric layer 66 (e.g., TEOS) over the patterned amorphous silicon layer 110 may be employed and is intended to fall within the scope of the hereto appended claims. For example, the etch process 130 may include using a MERIE system with power within the range of about 1000 W to 2000 W; pressure within the range of about 20 mT to 100 mT; and a gas chemistry including $C_4F_8$ at about 50 sccm to 20 sccm; CO at about 50 sccm to 500 sccm; Ar at about 50 sccm to 500 sccm; and $O_2$ at about 0 sccm to 10 sccm. The selectivity to the dielectric layer 66 over the hard mask 110 may range from 5:1 to greater than 40:1. Any remaining ultra-thin photoresist 100 (not shown) will be removed as well during the etch process 130 partly because of its thinness and inability to serve as a sole etch barrier for the dielectric layer etch 130. However, if desired the ultra-thin photoresist 100 may be completely stripped away prior to performing the etch process 130.

Figure 13:
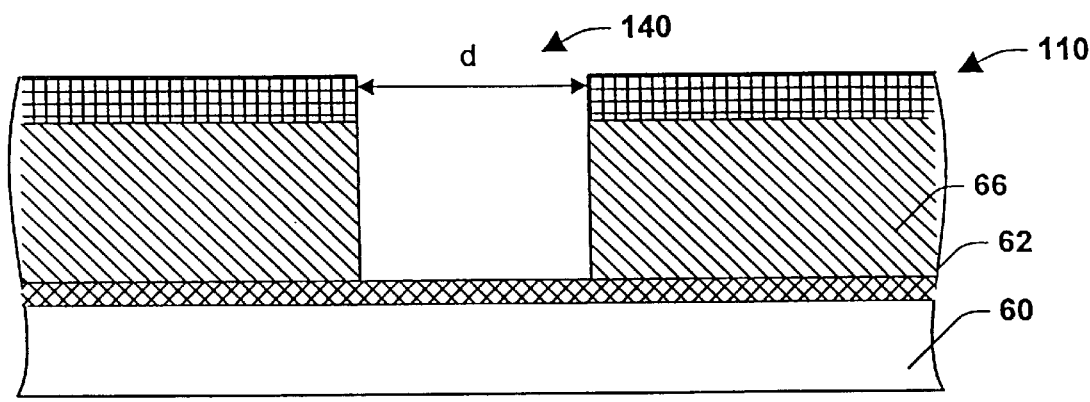
FIG. 13 is a schematic cross-sectional illustration of the amorphous silicon layer and dielectric layer of FIG. 12 after the etching step is substantially complete to form a contact hole in accordance with one aspect of the present invention.
Figure 14:
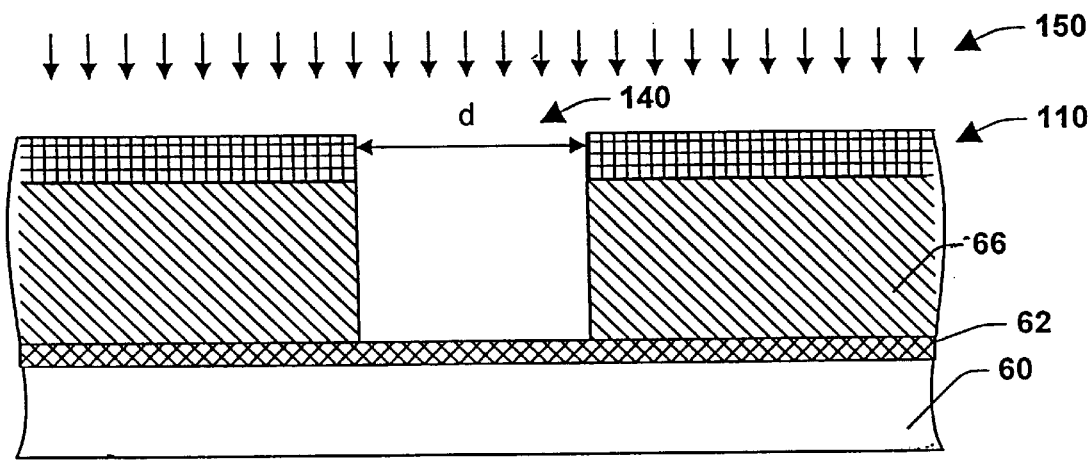
FIG. 14 is a schematic cross-sectional illustration of the contact hole of FIG. 13 undergoing a filling (plugging) step with a conductive material to form a via in accordance with one aspect of the present invention.
Figure 15:
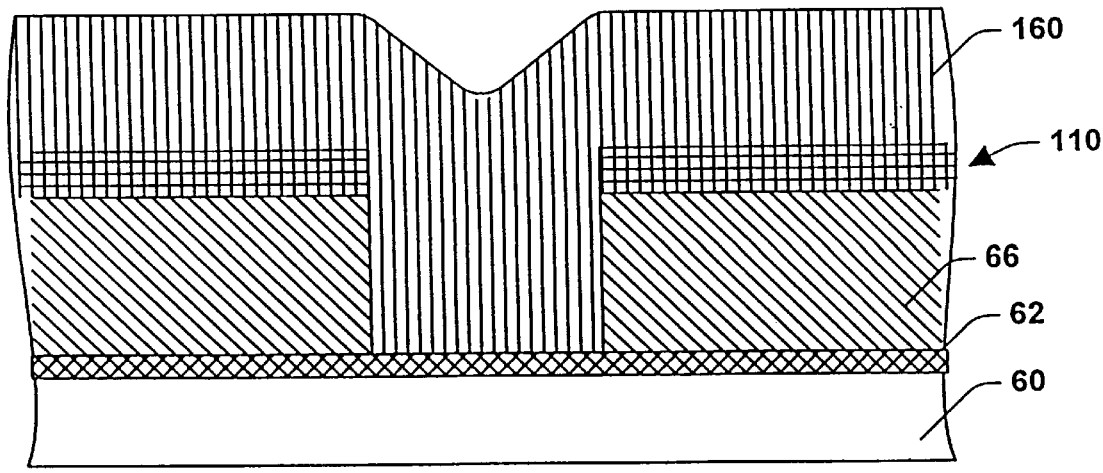
FIG. 15 is a schematic cross-sectional illustration of a via after the filling step of FIG. 14 is substantially complete in accordance with one aspect of the present invention.

FIG. 13 illustrates a contact hole 140 formed in substantial part. Thereafter, in FIGS. 14 and 15 the contact hole 140 undergoes a filling process 150 wherein a conductive filler material 160 (e.g., W, Cu) fills the contact hole 140 to form a plug which provides a conductive pathway through the dielectric layer 66 to connect interconnects of different conductor layers (e.g., 50, 52). Although, the present invention is described with respect to forming only two conductive layers for ease of understanding, it is to be appreciated that many more conductive layers separated with the dielectric material 66 may be formed, and such structures are intended to fall within the scope of the hereto appended claims. While different conductive materials are suitable to fill the contact hole 140, in this example tungsten forms the conductive filler material 160. The tungsten filled contact hole is referred to as a tungsten plug (which is the via 32). Copper, aluminum or an aluminum alloy are exemplary of other plug conductors. The vias 32 may comprise any other suitable conductive material, which is chemical-vapor deposited with a flow rate sufficient to fill the contact holes 140 so as to have an aspect ratio greater than, for example, 4:1.

In an alternative embodiment, the vias 32 may include copper (Cu). Since Cu easily diffuses into dielectric materials, a damascene process may be employed to create a barrier layer (e.g., tantalum nitride (TaN)) between the Cu and the dielectric 60 so as to mitigate diffusion of the Cu into the dielectric 60. Damascene techniques are known in the art, and therefore further discussion related thereto is omitted for sake of brevity. It is to be appreciated that the damascene technique may be performed to generate a barrier layer between any other suitable metal (e.g., tungsten) employed in the formation of the vias 32.

Figure 16:
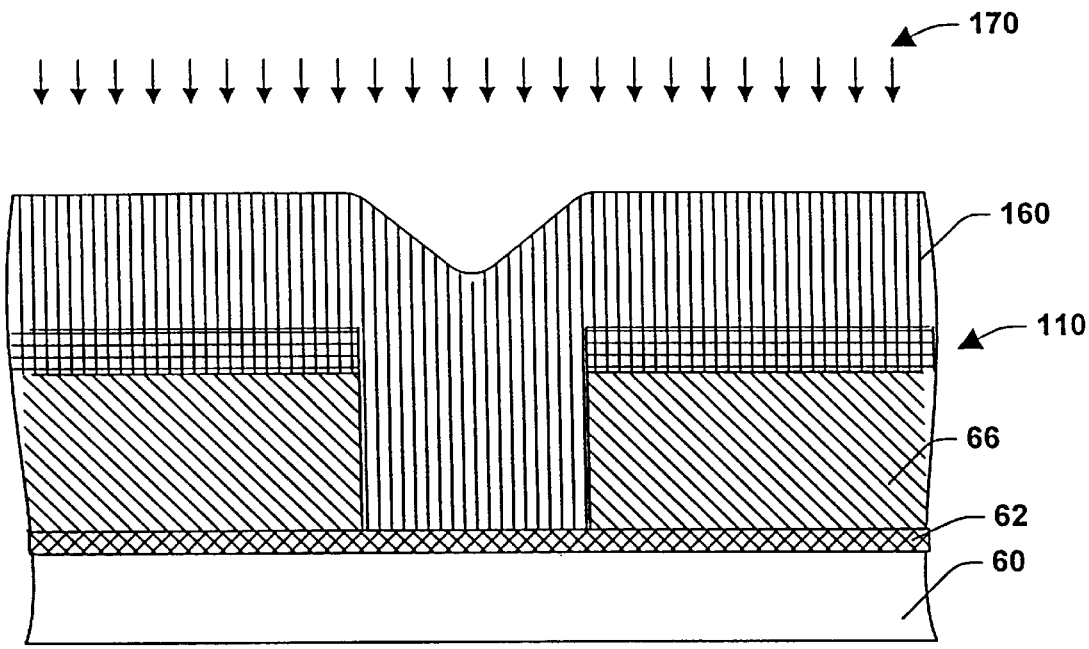
FIG. 16 is a schematic cross-sectional illustration of the conductive material of FIG. 15 undergoing a planarization process in accordance with one aspect of the present invention.
Figure 17:
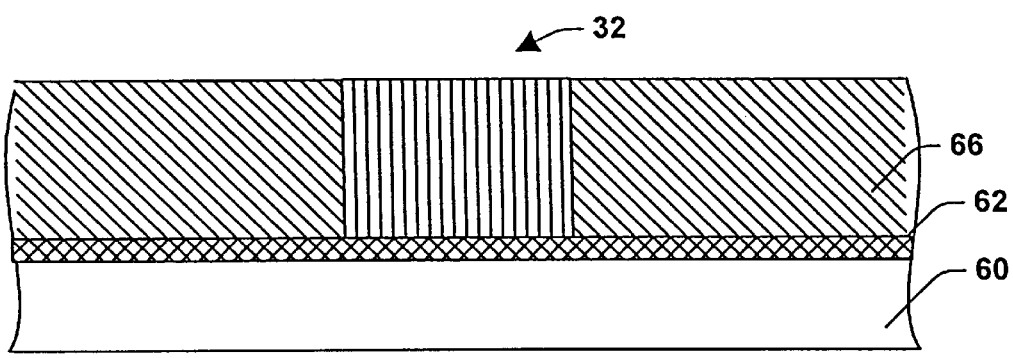
FIG. 17 is a schematic cross-sectional illustration of the via substantially complete in accordance with one aspect of the present invention.

Turning now to FIG. 16, the hard mask 110 and the plug material 160 are removed from the upper surface of dielectric layer 66 using, for example, sacrificial etchback or chemical mechanical polishing (CMP) step 170 to remove and planarize the plug material 160 and hard mask layer 110 so as to result in the via structure 32 shown in FIG. 17.

Figure 18:
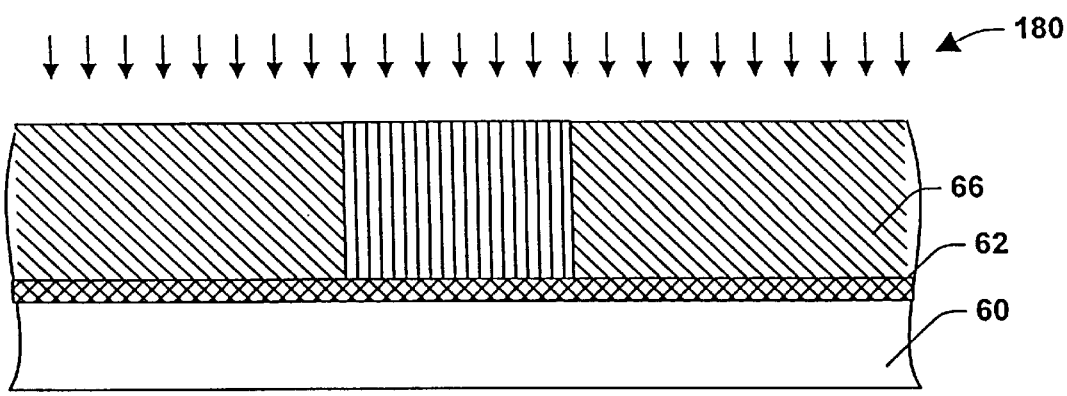
FIG. 18 is a schematic cross-sectional illustration of a second metal layer being formed over the via structure in accordance with one aspect of the present invention.
Figure 19:
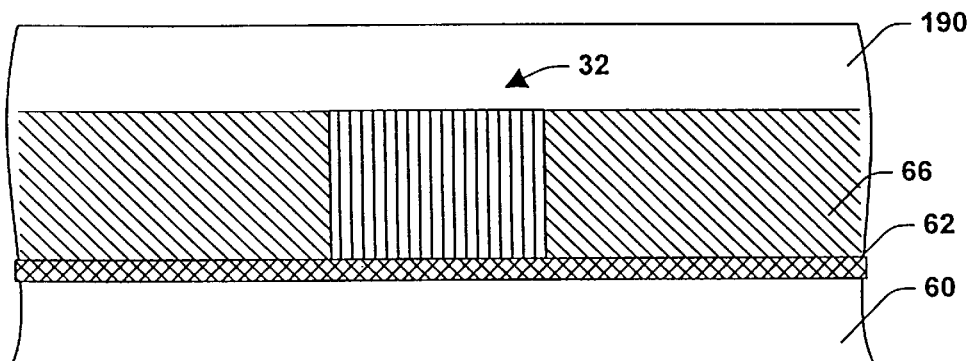
FIG. 19 is a schematic cross-sectional illustration of the second metal layer formed in substantial part in accordance with one aspect of the present invention.
Figure 22:
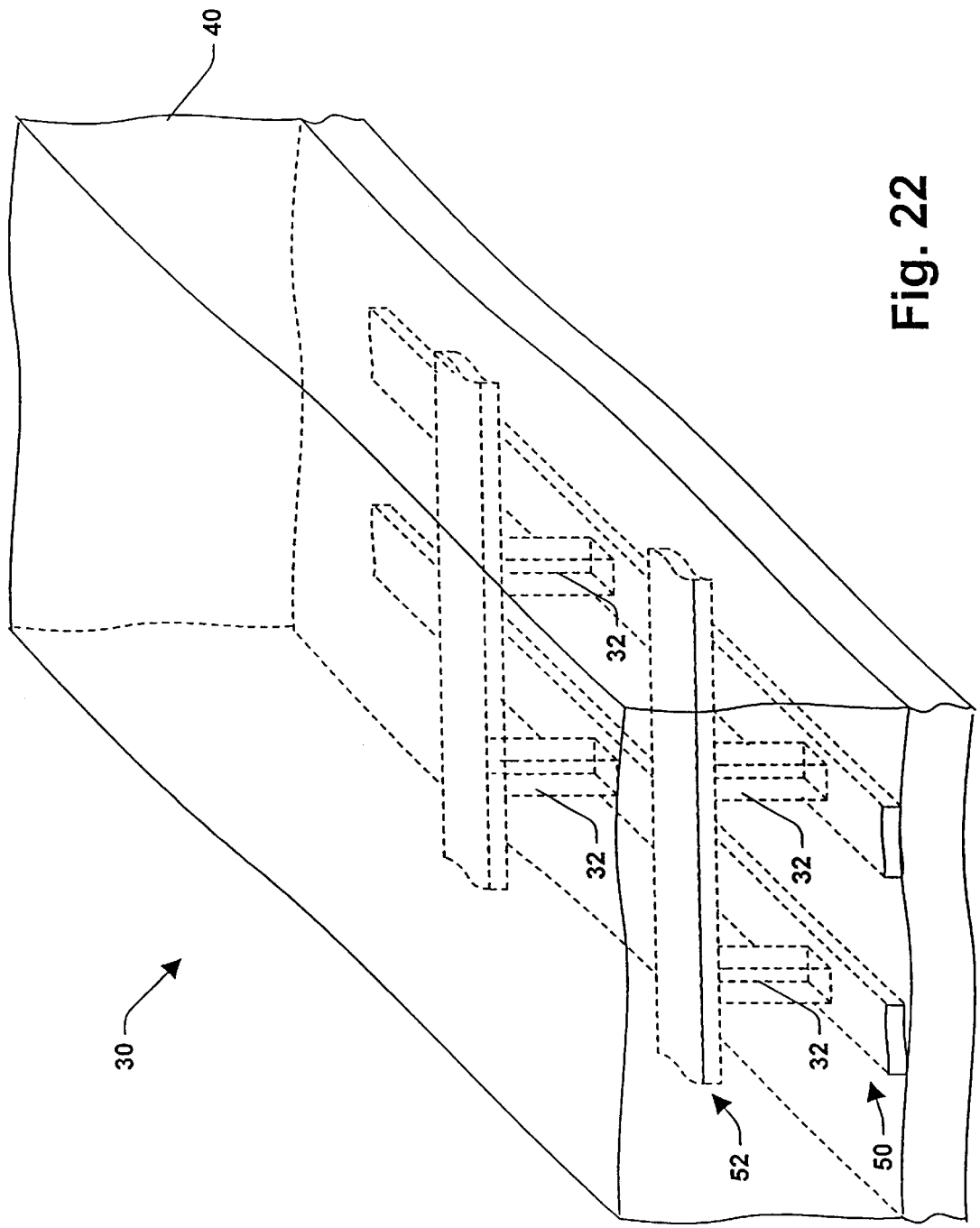
FIG. 22 is a perspective illustration of the multi-layered interconnect structure of FIG. 21 in accordance with one aspect of the present invention.

FIG. 18 illustrates the via structure 32 undergoing a deposition step 180 to deposit a second metal layer 190 (FIG. 19) which is part of the conductive layer 52 (FIG. 2). The second metal layer 190 may be deposited by any of a variety of suitable deposition techniques, such as CVD processes including low pressure chemical vapor deposition (LPCVD) and plasma enhanced chemical vapor deposition (PECVD), melting or sputtering. The second metal layer 190 may comprise any suitable conductive material and preferably includes a member selected from the group consisting of refractory materials, such as titanium and titanium alloys, tungsten and tungsten alloys, aluminum and aluminum alloys, copper and copper alloys and polycrystalline silicon. Although not shown, it is to be appreciated that a second metal patterning and etch process is performed so as to create the conductive layer 52 (FIGS. 2 and 22).

Figure 20:
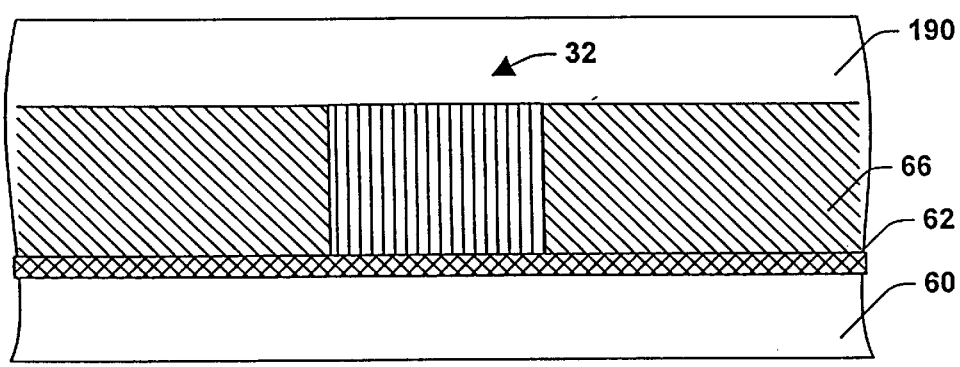
FIG. 20 is a schematic cross-sectional illustration of second dielectric layer being formed over the second metal layer in accordance with one aspect of the present invention.
Figure 21:
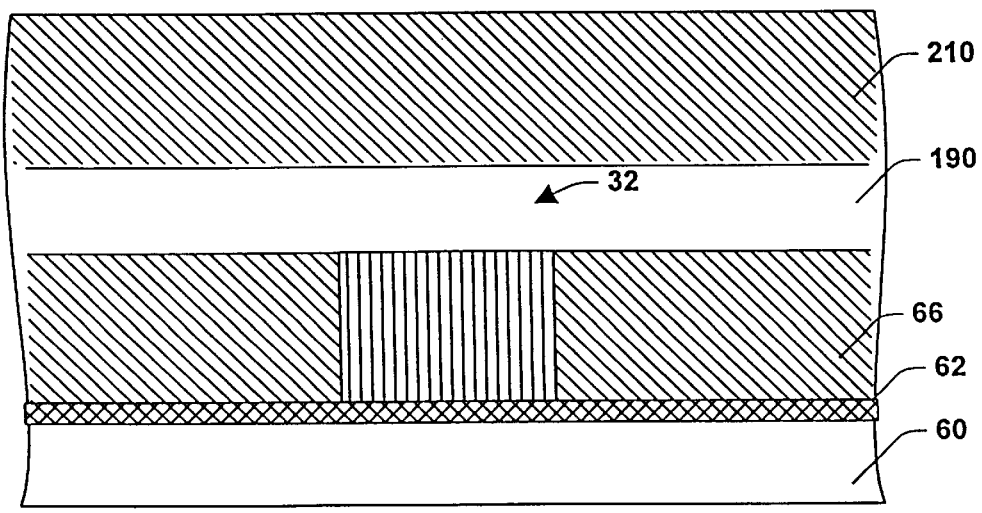
FIG. 21 is a schematic cross-sectional illustration of the second dielectric layer formed in substantial part so as to form a multi-layered interconnect structure in accordance with one aspect of the present invention.

In FIG. 20, a dielectric deposition step 200 is performed to deposit a dielectric layer 210 (FIG. 21) so as to substantially complete forming the dielectric insulating medium 40 (FIG. 2). The dielectric layer 210 may comprise any suitable insulating material employable in the semiconductor industry for forming an insulating layer. Preferably, the dielectric layer 210 comprises TEOS. The dielectric layer 210 may be deposited by any suitable process (e.g., Low Pressure Chemical Vapor Deposition (LPCVD), Plasma Enhanced Chemical Vapor Deposition (PECVD), or High Density Plasma Chemical Vapor Deposition (HDPCVD)) to a desired thickness so as to result in the multi-layered interconnect structure 32 illustrated in FIG. 22.

Thus the present invention provides for a method of fabricating a via structure with critical feature dimensions below about the 0.25 $\mu$m level.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming a via, comprising the steps of:
   forming a dielectric layer on an anti-reflective coating (ARC) layer covering a first metal layer;
   forming an amorphous silicon layer on the dielectric layer;
   forming an ultra-thin photoresist layer on the amorphous silicon layer, the ultra-thin photoresist layer having a thickness within the range of about 50 Å to 2000 Å;
   patterning the ultra-thin photoresist layer with short wavelength radiation to define a pattern for the via, the short wavelength radiation falling within the range of about 4 nm to 13 nm;
   using the ultra-thin photoresist layer as a mask during a first etch step to transfer the via pattern to the amorphous silicon layer, the first etch step including a high density $Cl_2$ based etch chemistry that is selective to the amorphous silicon layer over the ultra-thin photoresist layer; and
   using the amorphous silicon layer as a hard mask during a second etch step to form a contact hole corresponding to the via pattern by etching portions of the dielectric layer.

2. The method of claim 1 wherein the first etch step is highly selective to the amorphous silicon layer over the dielectric layer so as to mitigate damage to the dielectric layer.

3. The method of claim 1, wherein the second etch step is highly selective to the dielectric layer over the hard mask and the ARC.

4. The method of claim 1 further including the step of filling the contact hole with a conductive material.

5. The method of claim 4 further including the step of using at least one of tungsten, copper, aluminum, or an aluminum alloy as the conductive material.

6. The method of claim 1, further including the step of forming the amorphous silicon layer to have a thickness within the range of about 50 Å–2000 Å.

7. The method of claim 1, further including the step of forming the amorphous silicon layer to have a thickness within the range of about 50 Å–1500 Å.

8. The method of claim 1, further including the step of forming the amorphous silicon layer to have a thickness within the range of about 50 Å–1000 Å.

9. The method of claim 1, further including the step of forming the amorphous silicon layer to have a thickness within the range of about 50 Å–500 Å.

10. The method of claim 1, fuirther including the step of forming the ultra-thin photoresist layer to have a thickness within the range of about 500 Å to 5000 Å.

11. The method of claim 1, further including the step of forming the ultra-thin photoresist layer to have a thickness within the range of about 1000 Å to 4000 Å.

12. The method of claim 1, further including the step of forming the ultra-thin photoresist layer to have a thickness within the range of about 500 Å to 2000 Å.

13. The method of claim 1, further including the step of using radiation having a wavelength less than about 200 nm.

14. The method of claim 1, further including the step of using radiation having a wavelength less than about 160 nm.

15. The method of claim 1, further including the step of using radiation having a wavelength less than about 100 nm.

16. The method of claim 1, further including the step of using radiation having a wavelength of about 13 nm.

17. The method of claim 1, further including the step of using radiation having a wavelength of about 11 nm.

18. The method of claim 1, further including the step of using X-rays as the radiation.

19. The method of claim 1, further including the step of using extreme ultra-violet radiation as the short wavelength radiation.

20. The method of claim 1, further including the step of using deep ultra-violet radiation as the short wavelength radiation.

21. The method of claim 1, further including an etch chemistry for the first etch having a selectivity to the amorphous silicon layer over the ultra-thin photoresist layer greater than about 40:1.

22. The method of claim 1, further including an etch chemistry for the first etch having a selectivity to the amorphous silicon layer over the ultra-thin photoresist layer greater than about 30:1.

23. The method of claim 1, further including an etch chemistry for the first etch having a selectivity to the amorphous silicon layer over the ultra-thin photoresist layer greater than about 20:1.

24. The method of claim 1, further including an etch chemistry for the first etch having a selectivity to the amorphous silicon layer over the ultra-thin photoresist layer and the dielectric layer greater than about 10:1.

25. The method of claim 1, further including an etch chemistry for the first etch having a selectivity to the amorphous silicon layer over the ultra-thin photoresist layer and the dielectric layer greater than about 5:1.

26. The method of claim 1, further including an etch chemistry for the second etch having a selectivity to the dielectric layer over the amorphous silicon layer greater than about 5:1.

27. The method of claim 1, further including an etch chemistry for the second etch having a selectivity to the dielectric layer over the amorphous silicon layer greater than about 6:1.

28. A method of forming a via, comprising the steps of:
   forming a dielectric layer on an anti-reflective coating (ARC) layer covering a first metal layer;
   forming an amorphous silicon layer on the dielectric layer;
   forming an ultra-thin photoresist layer on the amorphous silicon layer, the ultra-thin photoresist layer having a thickness within the range of about 50 Å to 2000 Å;
   patterning the ultra-thin photoresist layer with short wavelength radiation to define a pattern for the via, the short wavelength radiation falling within the range of about 4 nm to 13 nm;
   using the ultra-thin photoresist layer as a mask during a first etch step to transfer the via pattern to the amorphous silicon layer, the first etch step including a $Cl_2$ and HBr based etch chemistry that is selective to the amorphous silicon layer over the ultra-thin photoresist layer; and
   using the amorphous silicon layer as a hard mask during a second etch step to form a contact hole corresponding to the via pattern by etching portions of the dielectric layer.

29. The method of claim 28, further including the step of using a power level within the range of 300 W to 700 W; pressure within the range of 10 mT to 250 mT; $Cl_2$ within the range of 30 sccm to 100 sccm; and HBr within the range of 30 sccm to 100 sccm.

30. A method of forming a via structure, comprising the steps of:

forming a dielectric layer on an anti-reflective coating (ARC) layer covering a first metal layer;

forming an amorphous silicon layer on the dielectric layer, the amorphous silicon layer having a thickness within the range of 50 Å–2000 Å;

forming an ultra-thin photoresist layer on the amorphous silicon layer, the ultra-thin photoresist layer having a thickness within the range of 50 Å–2000 Å;

patterning the ultra-thin photoresist layer with short wavelength radiation to define a pattern for a via, the short wavelength radiation falling within the range of about 11 nm to 13 nm;

using the ultra-thin photoresist layer as a mask during a first etch step to transfer the via pattern to the amorphous silicon layer, the first etch step including a high density $Cl_2$ based etch chemistry that is selective to the amorphous silicon layer over the ultra-thin photoresist layer and the dielectric layer; and using the amorphous silicon layer as a hard mask during a second etch step to form a contact hole corresponding to the via pattern by etching portions of the dielectric layer.

31. A method of forming a multi-layered interconnect structure, comprising the steps of:

forming a first dielectric layer on an anti-reflective coating (ARC) layer covering a first metal layer;

forming an amorphous silicon layer on the dielectric layer, the amorphous silicon layer having a thickness within the range of 50 Å–2000 Å;

forming an ultra-thin photoresist layer on the amorphous silicon layer, the ultra-thin photoresist layer having a thickness within the range of 50 Å–2000 Å;

patterning the ultra-thin photoresist layer with short wavelength radiation to define a pattern for a via, the short wavelength radiation falling within the range of about 11 nm to 13 nm;

using the ultra-thin photoresist layer as a mask during a first etch step to transfer the via pattern to the amorphous silicon layer, the first etch step including a high density $Cl_2$ based etch chemistry that is selective to the amorphous silicon layer over the ultra-thin photoresist layer;

using the amorphous silicon layer as a hard mask during a second etch step to form a contact hole corresponding to the via pattern by etching portions of the dielectric layer;

filling the contact hole with a conductive material so as to form the via;

removing the hard mask and planarizing the conductive material by way of chemical mechanical polishing (CMP);

forming a second metal layer over the via; and forming a second dielectric layer over the second metal layer.

32. The method of claim 31 wherein the first etch step is highly selective to the amorphous silicon layer over the dielectric layer so as to mitigate damage to the dielectric layer.

\* \* \* \* \*

UNITED STATES PATENT AND TRADEMARK OFFICE
CERTIFICATE OF CORRECTION

PATENT NO.: 6,165,695

DATED: December 26, 2000

INVENTOR(S): Yang, et al.

It is certified that error appears in the above-identified patent and that said Letters Patent is hereby corrected as shown below:

In column 2, line 54: please replace "formning" with --forming--.

Signed and Sealed this

First Day of May, 2001

Attest:

NICHOLAS P. GODICI

Attesting Officer     Acting Director of the United States Patent and Trademark Office